United States Patent [19]
Levinson

[11] Patent Number: 5,197,291
[45] Date of Patent: * Mar. 30, 1993

[54] SOLAR POWERED THERMOELECTRIC COOLING APPARATUS

[75] Inventor: Lionel M. Levinson, Schenectady, N.Y.

[73] Assignee: General Electric Company, Schenectady, N.Y.

[*] Notice: The portion of the term of this patent subsequent to Mar. 12, 2008 has been disclaimed.

[21] Appl. No.: 611,566

[22] Filed: Nov. 13, 1990

[51] Int. Cl.$^5$ .............................................. G01R 21/06
[52] U.S. Cl. .......................................... 62/3.2; 62/3.7; 62/236; 136/291; 429/62
[58] Field of Search ................ 62/3.2, 3.6, 3.7, 259.2, 62/236; 136/291; 429/62

[56] References Cited

U.S. PATENT DOCUMENTS

| | | | |
|---|---|---|---|
| 2,514,881 | 7/1950 | Leupold | 429/62 |
| 3,091,939 | 6/1963 | Baude | 62/3.7 |
| 3,170,130 | 2/1965 | Begley | 62/3.2 |
| 3,281,073 | 10/1966 | Chou et al. | 62/3.7 |
| 3,387,199 | 6/1968 | Billerbeck et al. | 323/906 |
| 4,463,569 | 8/1984 | McLarty | 62/32 |
| 4,639,883 | 1/1987 | Michaelis | 364/557 |
| 4,981,019 | 1/1991 | Hicks et al. | 62/457.9 |
| 4,999,576 | 3/1991 | Levinson | 324/142 |

Primary Examiner—Albert J. Makay
Assistant Examiner—William C. Doerrler
Attorney, Agent, or Firm—Donald S. Ingraham; Marvin Snyder

[57] ABSTRACT

A thermoelectric module powered by a solar cell is used to cool a battery which serves as a backup power supply in a time-of-use power meter. Solar irradiation incident on the power meter containing the battery, of sufficient intensity to result in heating of the battery, concurrently causes the solar cell to generate an electric current. If the battery temperature rises above a predetermined level, the thermoelectric module cools the battery in dependence on the power generated by the solar cell.

9 Claims, 1 Drawing Sheet

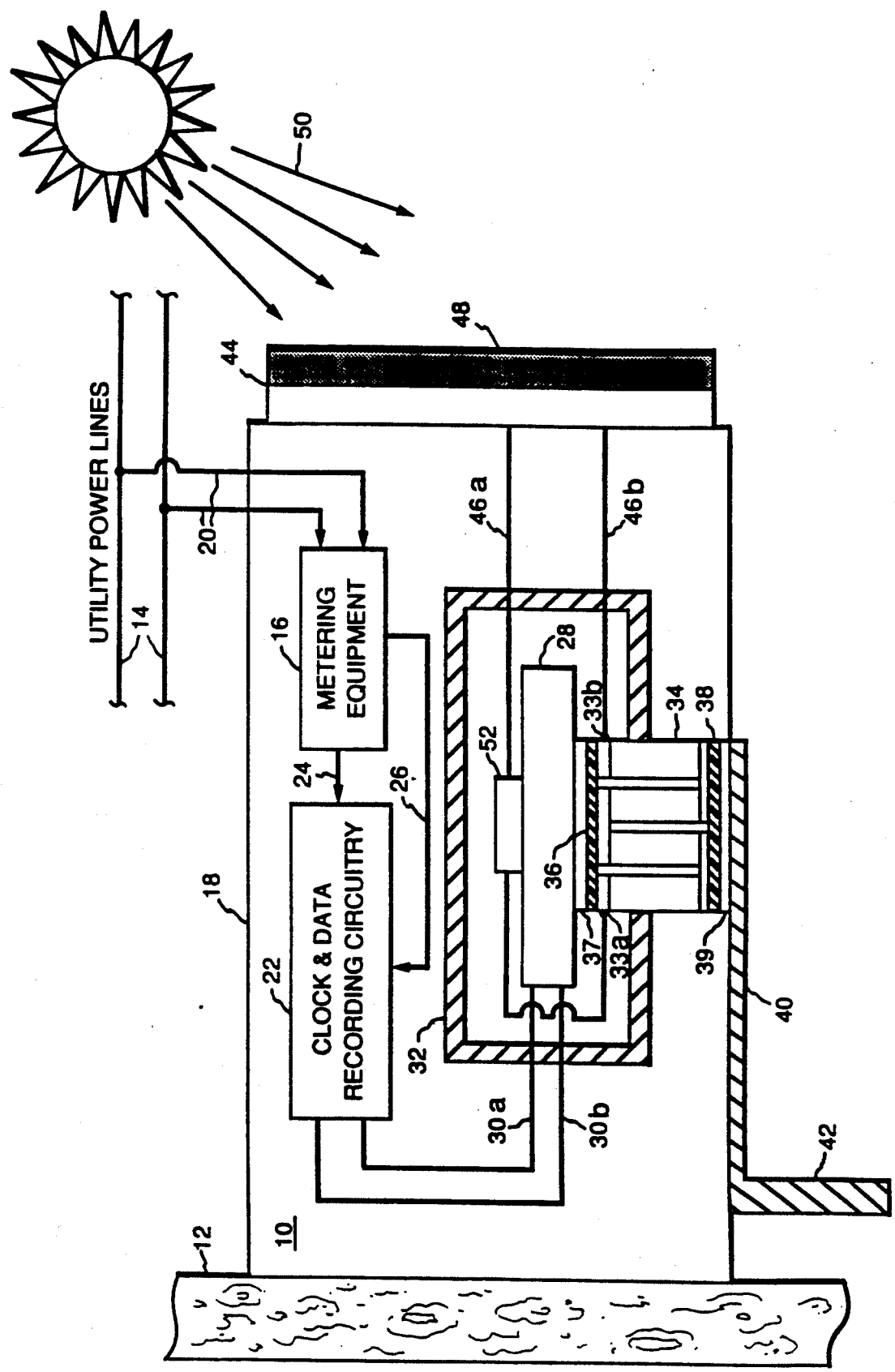

5,197,291

SOLAR POWERED THERMOELECTRIC COOLING APPARATUS

The present invention relates to cooling systems for electrical energy supply devices and, more particularly, to a system in which a solar powered thermoelectric module is used to cool a battery exposed to heating from solar irradiation.

BACKGROUND OF THE INVENTION

It is well known in the art that the temperature of an electric device can affect its performance and service life. Temperature can be an especially significant factor when the electrical device is a battery.

To ensure the reliable functioning of a backup power source which comprises a battery, the battery must be replaced relatively frequently, regardless of the number of load cycles imposed upon the battery, to assure that backup power will be available when required. This periodic replacement is particularly required when the backup battery is used in a time-of-use power meter. These power meters (which, more accurately, are watt-hour meters) are typically mounted on the side of buildings, where they are exposed to sunlight. High battery temperatures resulting from heating by solar irradiation reduces the service life of the installed batteries, necessitating monitoring or replacement of the batteries at more frequent intervals than would be required if the batteries were kept cool.

Time-of-use (TOU) power meters measure the amount of power delivered and they also contain circuitry which records power consumption as a function of the time of day and day of the week. The TOU power meter thus allows utility companies to adopt rate structures made up of different rates for power used during particular periods of the day or on particular days of the week. Batteries are typically used to provide back-up power in the event that power from the circuitry's normal power supply, the utility line, is interrupted for some reason, e.g. due to a lightning strike. Maintaining operation of the clock function during a power outage is critical for accurate resumption of TOU power metering when power is restored on the utility line.

Batteries that are used for such purposes must be reliable and have a long service life in order to minimize the administrative burden, labor and economic expense of replacing them. Some batteries, such as solid-state lithium-iodine type batteries, have a service life in excess of twenty years if their temperature is maintained in the range of approximately 10° C.–37° C. The longer the battery is exposed to temperatures above that range, however, the shorter becomes the service life of the battery, and its power output may become unreliable. For example, in many southwestern parts of the United States the average yearly temperature is approximately 20° C. (e.g. in Phoenix, Ariz.), i.e. well within the permissible temperature range. However, temperature extremes on many days can rise above that range. Further, solar irradiation in those areas can be of an intensity to cause a rise in battery temperature above ambient air temperature. Such a temperature rise, when combined with a high ambient temperature, creates conditions which can have a deleterious effect on a backup power supply battery exposed to such conditions.

To avoid battery failure or deterioration, a number of techniques have been suggested to compensate for this undesirable heating. It has already been proposed to use a thermoelectric module, powered from the utility line, to cool a battery in a TOU power meter. Such an arrangement is disclosed and claimed in U.S. Pat. No. 4,999,576 of L. Levinson, which is assigned to the present assignee. As the primary source of undesired battery heating in an externally mounted TOU power meter is solar irradiation, there is typically no need to have the cooling apparatus in operation in the absence of such heating. Consequently, in systems that use thermoelectric cooling modules powered from a utility line, special control circuitry is used to monitor battery temperature and to activate the cooling module only when the temperature rises above a selected level. In addition, the module powered from the utility line is unable to cool the battery during a power outage. A line-powered thermoelectric module also requires power supply equipment to step down the line voltage and convert the AC to DC. The added complexity of this control and power supply equipment, plus the additional maintenance requirements associated with it, may reduce the commercial attractiveness of such a cooling system.

Another technique suggested to assist battery cooling is a passive cooling system utilizing a chimney effect to generate an air flow across a heat exchanger thermally coupled with the battery. Such an arrangement is disclosed and claimed in L. Levinson et al. co-pending application Ser. No. 07/444,338, filed 1 Nov. 1989, now U.S. Pat. No. 5,035,964, and continuation-in-part application Ser. No. 07/699,085, filed May 13, 1991 which are assigned to the assignee of the present invention. The passive cooling system relies on solar irradiation to heat air in a lower part of the chimney. As the air ascends in the chimney, it produces an air flow across the heat exchanger surfaces located within the chimney. This arrangement uses air at a temperature above ambient temperature as the cooling medium, and thus may not provide as immediate and as effective cooling of the battery as a thermoelectric module.

OBJECTS OF THE INVENTION

It is accordingly a primary object of the present invention to provide new and improved cooling apparatus for a device exposed to heating due to incident solar irradiation that does not require stepping down and rectifying power from the utility line to power a thermoelectric module thermally coupled to cool the device; does not require special module control circuitry; that is commercially attractive for use in TOU power meters; and that provides immediate and effective cooling of the device.

It is a further object of the present invention to provide novel solar-powered apparatus for thermoelectrically cooling a device subject to heating by solar irradiation.

It is a further object of this invention to provide improved, efficient, and cost-effective cooling apparatus for a backup power supply battery in a TOU power meter.

These and other objects of the invention, together with the features and advantages thereof, will become apparent from the following detailed specification when read with the accompanying drawing in which the sole FIGURE is a side elevation view, partially in block diagram form, of the present invention.

SUMMARY OF THE INVENTION

In accordance with the present invention a solar cell exposed to solar irradiation is used to power a thermoelectric (TE) module. The module is thermally coupled to a device, such as a battery, which is concurrently subjected to heating due to the solar irradiation. The TE module acts to cool the battery in response to the power output of the solar cell, and thus in dependence upon the intensity of the solar irradiation, thereby prolonging the service life of the battery.

DETAILED DESCRIPTION

As illustrated in the drawing, a time-of-use (TOU) power meter, also referred to as a TOU watt-hour meter and generally indicated at 10, is mounted on the side of a structure 12, for example a private residence, to which electric service is provided by utility power lines 14. Metering equipment 16, contained in a meter housing 18, is electrically connected to utility power line 14 via a service drop 20 to measure electric power delivered to the consumer.

Power meter 10 further includes clock and data recording circuitry 22 which is electrically connected by way of signal path 24 to metering equipment 16. Circuitry 22 provides a clock function and necessary recording functions to store power use measurements as a function of time, i.e. hour of the day and day of the week, and requires constant electric power to maintain these functions. During normal operation, circuitry 22 is powered from utility power lines 14 through a power cable.

To provide power to circuitry 22 when there is an interruption on utility lines 14, a backup electrical power supply is incorporated in the power meter. The backup power supply typically is an electric battery 28 that supplies DC power to circuitry 22 through leads 30a, 30b. The battery may be of any type compatible with the requirements of the power meter, e.g. a long life lithium-based battery. Battery 28 is contained in a battery enclosure 32, which is typically thermally insulated and located in the interior of power meter housing 18.

In accordance with the present invention, a device exposed to heating from incident solar irradiation, such as battery 28, is cooled by a thermoelectric (TE) module 34, e.g. of the type discussed in *Modern Thermoelectrics*, D. M. Rowe and C. N. Bhandari, Reston Publishing Co., 1983. Thermoelectric modules operate on the basis of the Peltier effect, by which a current flowing through a junction of dissimilar metals causes heat to be liberated or absorbed, depending on the direction of the current. In typical thermoelectric module installations, a number of p-type and n-type semiconductor elements are connected together, electrically in series and thermally in parallel. The thermal connections form two thermal junctions for the module. A voltage of a selected polarity can be applied to the thermoelectric module to cause a current to pass through the module, resulting in heat being pumped from one thermal junction, known as the cold junction, to the other junction, known as the hot junction. The rate of heat transfer from the cold to the hot junction is a function of the electrical current flowing through the module and the number of semiconductor elements connected together in the TE module. A reversal of the voltage polarity results in a reversal of the direction of heat transfer across the module.

In the present invention, when electric power is applied to terminals 33a and 33b of TE module 34, the module operates to pump heat from its cold junction 36 to its hot junction 38. Module 34 is thermally coupled at its cold junction 36 via a thermally conductive pad 37 to battery 28 and at its hot junction 38 via a thermally conductive pad 39 to a suitable heat sink, such as the ambient atmosphere or other cooling medium. Pads 37 and 39 are advantageously fabricated from a solder or similar material to facilitate mechanical attachment of module 35 to the battery and to the heat sink. In the illustrated embodiment, heat is conducted away from TE module 34 via a conducting strap 40, comprised of an appropriate thermally conductive material, such as copper or aluminum, to a heat sink plate 42, which may comprise any suitable thermally conductive material, such as a metal. Plate 42 has a surface sufficiently large to facilitate efficient transfer of the heat received to the atmosphere or other heat sink. It may be provided with fins, or with a honeycomb-like structure, to further enhance heat transfer to the atmosphere.

Thermoelectric module 34 may be located as shown in the drawing or it may be positioned entirely inside or entirely outside insulated enclosure 32, depending upon space or other pertinent design criteria. In each instance, however, cold junction 36 is thermally coupled to battery 28, while hot junction 38 is thermally coupled, directly or through intermediate thermal conductors, to the heat sink.

In accordance with the present invention, thermoelectric module 34 receives electric power at terminals 33a, 33b from a solar cell 44 through leads 46a, 46b and a temperature responsive switch 52. Solar cells for producing electrical energy upon exposure to radiation, such as light, are known in the art. Solar cell 44 may comprise one or more suitable photovoltaic cells capable of producing the power required to operate module 34. The solar cell may be fabricated of silicon cells containing various dopants; of thin films of gallium arsenide, cadmium sulfide/copper sulfide; or of other appropriate photocrystalline materials.

Solar cell 44 includes at least one solar collecting panel 48, which is sized to produce the electrical output required by the TE module. The amount of electrical power required to operate thermoelectric module 34 is small enough so that solar cell 44 can be relatively inexpensive and simple to construct. For example, in an environment where solar irradiation is of a magnitude to cause heating that adversely affects a standby power supply battery, a typical value for the energy received on the earth's surface from solar irradiation is 1,000 watts per square meter. By way of example, and not limitation, a solar cell with an efficiency of 10 percent and having a 100 square centimeter solar panel exposed to such irradiation can develop approximately 1 volt-amp of output power. This power level is sufficient to energize a thermoelectric module to pump a few hundred milliwatts of heat across a temperature drop of 20 to 30 degrees centigrade. The amount of heat transferred in this manner is sufficient to keep the battery of a TOU power meter installation, which operates under ambient conditions normally expected in the southwestern United States, at a temperature that prolongs its service life. As the intensity of incident solar irradiation changes, the electric power generated by the solar cell varies accordingly between low and maximum cell power output. Any change in electrical power supplied to the TE module produces a corresponding change in the amount of heat extracted from the battery by the TE module. Thus, a self regulating response is provided in dependence on the intensity of incident solar irradiation.

Solar cell 44 is positioned on power meter housing 18 so that its solar collecting panel 48 is exposed to incident solar irradiation 50 when such irradiation would concurrently cause undesirable heating of battery 28. As shown in the drawing, solar cell 44 is mounted on the side surface of power meter housing 18 opposite structure 12.

However, it may be mounted on any surface of power meter housing 18 where it will receive direct or reflected solar irradiation concurrently with the power meter to generate electric power in dependence upon the solar irradiation, provided only that the power generated is adequate to operate TE module 34. Alternative embodiments, not shown, may include an arrangement for pivotally mounting a solar cell on the power meter housing so that it can be adjustably oriented towards direct or reflected solar irradiation, or an arrangement for mounting the solar cell on an adjustable support mast to allow advantageous manual or automatic positioning of its solar collecting panel toward the source of the solar irradiation.

Lead 46a is connected to module 34 by way of temperature responsive switch 52 mounted on battery 28 to sense battery temperature. Switch 52 disconnects TE module 34 from solar cell 44 when the temperature of the battery falls below a selected level, say 10° C. For example, the battery temperature may remain low in winter due to low ambient air temperature, even though power meter 10 receives solar irradiation. Under such conditions, switch 52 will be open, thus interrupting electrical power flowing from solar cell 44 to TE module 34 to preclude further battery cooling.

It will be readily understood by those skilled in the art that the present invention is not limited to the specific embodiment described and illustrated herein. Many variations, modifications and equivalent arrangements will now be apparent to those skilled in the art, or will be reasonably suggested by the foregoing specification and drawings, without departing from the substance or scope of the invention. Accordingly, it is intended that the invention be limited only by spirit and scope of the appended claims.

What is claimed is:

1. Apparatus for cooling an electric battery exposed to heating due to incident solar irradiation, comprising: a solar cell for generating direct current electric power responsive to said solar irradiation, the amount of electric power generated by said solar cell corresponding to the intensity of said incident solar irradiation; a thermoelectric module electrically coupled to receive said direct current electric power from said solar cell, said module being thermally coupled to said electric battery to directly extract heat therefrom in dependence upon the amount of electric power generated by said solar cell in a self regulating manner such that the amount of heat extracted corresponds with the intensity of said incident radiation.

2. The apparatus of claim 1 and further comprising a heat sink member thermally coupled to said module for dissipating said extracted heat.

3. The apparatus of claim 1 and further comprising means for interrupting the energization of said module by said solar cell when the temperature of said device drops below a predetermined level.

4. The apparatus of claim 2 and further comprising a heat sink member thermally coupled to said module for dissipating said extracted heat.

5. The apparatus of claim 2 and further comprising means for interrupting the energization of said module by said solar cell when the temperature of said device drops below a predetermined level.

6. A time-of-use power meter comprising: means for measuring the amount of electric power drawn from a utility power line; clock and data recording circuitry coupled to said measuring means for recording electrical energy usage and time-of-use information, said recording circuitry being connected for energization from said utility power line; a backup power supply for said clock and data recording circuitry, said backup power supply being subject to heating due to incident solar irradiation of a magnitude capable of adversely affecting the operation of said power supply; a solar cell responsive to said solar irradiation for generating electric power; and a thermoelectric module electrically coupled to said solar cell, said module being thermally coupled to said backup power supply for extracting heat therefrom in dependence upon the power output of said solar cell.

7. The power meter of claim 6 wherein said backup power supply is an electric battery.

8. The power meter of claim 6 and further comprising means for disconnecting said module from said solar cell when the temperature of said backup power supply is below a predetermined level.

9. The power meter of claim 6 and further comprising a heat sink member thermally coupled to said module for dissipating the extracted heat.

* * * * *